(12) United States Patent
King et al.

(10) Patent No.: US 10,709,021 B2
(45) Date of Patent: Jul. 7, 2020

(54) FLEXIBLE HYBRID ELECTRONICS AND BATTERY WITH COMMON SUBSTRATE

(71) Applicant: Molex, LLC, Lisle, IL (US)

(72) Inventors: David Jonathan King, Eagan, MN (US); Robert Cartwright Irwin, Lakeville, MN (US); Jesse J. Cole, Savage, MN (US)

(73) Assignee: Molex, LLC, Lisle, IL (US)

( * ) Notice: Subject to any disclaimer, the term of this patent is extended or adjusted under 35 U.S.C. 154(b) by 0 days.

(21) Appl. No.: 16/424,652

(22) Filed: May 29, 2019

(65) Prior Publication Data

US 2019/0373734 A1 Dec. 5, 2019

Related U.S. Application Data

(60) Provisional application No. 62/677,650, filed on May 29, 2018.

(51) Int. Cl.
| | | |
|---|---|---|
| *H05K 1/00* | (2006.01) | |
| *H05K 1/18* | (2006.01) | |
| *H05K 1/03* | (2006.01) | |
| *H05K 5/03* | (2006.01) | |

(52) U.S. Cl.
CPC ........... *H05K 1/189* (2013.01); *H05K 1/0306* (2013.01); *H05K 1/0393* (2013.01); *H05K 1/181* (2013.01); *H05K 5/03* (2013.01); *H05K 2201/10015* (2013.01); *H05K 2201/10037* (2013.01); *H05K 2201/10098* (2013.01); *H05K 2201/10143* (2013.01)

(58) Field of Classification Search
USPC ........................................................ 361/749
See application file for complete search history.

(56) References Cited

U.S. PATENT DOCUMENTS

| 2014/0276167 A1* | 9/2014 | Dasgupta | ............. | A61B 5/4818 |
| | | | | 600/529 |
| 2017/0062309 A1* | 3/2017 | Ogras | ................ | H01L 23/4985 |

\* cited by examiner

*Primary Examiner* — Andargie M Aychillhum
(74) *Attorney, Agent, or Firm* — Molex, LLC

(57) ABSTRACT

A flexible hybrid electronics (FHE) device includes a common flexible substrate with a first surface and a second surface opposite the first surface. A printed circuit is coupled to the first surface of the common flexible substrate. A battery is coupled to the second surface of the common flexible substrate. At least one via connects the battery to the printed circuit through the common flexible substrate.

20 Claims, 1 Drawing Sheet

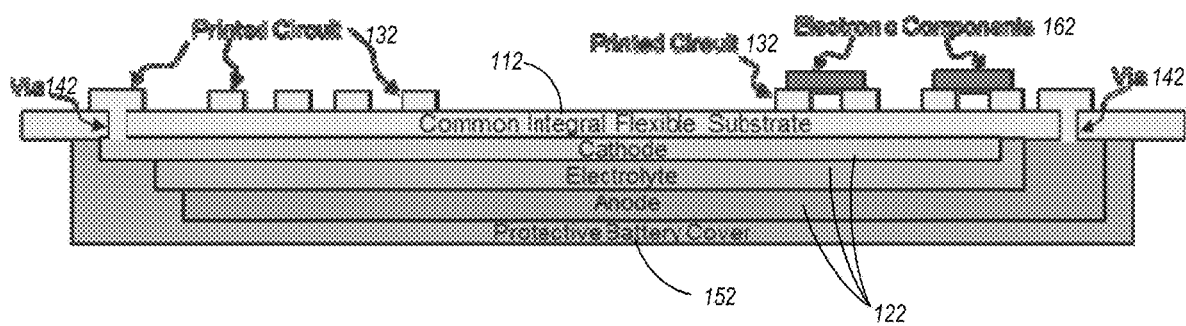

FLEXIBLE HYBRID ELECTRONICS AND BATTERY WITH COMMON SUBSTRATE

RELATED APPLICATIONS

This application claims the benefit under 35 U.S.C. § 119(e) of the filing date of U.S. Provisional Patent Application No. 62/677,650, for "FLEXIBLE HYBRID ELECTRONICS AND BATTERY WITH COMMON SUBSTRATE" which was filed on May 29, 2018, and which is incorporated here by reference.

TECHNICAL FIELD

This disclosure relates to the field of printed circuit technologies, more specifically to flexible hybrid electronics.

DESCRIPTION OF RELATED ART

Printed electronics and flexible hybrid electronics (FHE) are emerging technologies that integrate additive printing technologies (e.g., screen printing, flexographic printing, inkjet printing, or other additive deposition techniques) with traditional packaged components. Benefits of printed electronics and FHE include, among others, flexibility and conformability. However, there is a need for thinner form-factor powered products that include printed electronics and FHE for flexible and/or conformable applications.

Powered-FHE products available in the market include an electrical circuit printed on a flexible substrate, a separate battery attached to the circuit, and one or more conventional packaged components attached to the circuit, such as resistors, capacitors, inductors, microcontrollers, memory chips, wireless connectivity chips, and the like.

SUMMARY

In an example aspect, a flexible hybrid electronics (FHE) device includes a common flexible substrate with a first surface and a second surface opposite the first surface. A printed circuit is coupled to the first surface of the common flexible substrate. A battery is coupled to the second surface of the common flexible substrate. At least one via connects the battery to the printed circuit through the common flexible substrate.

BRIEF DESCRIPTION OF THE DRAWINGS

The present application is illustrated by way of example and not limited in the accompanying FIGURES in which like reference numerals indicate similar elements and in which:

FIG. 1 illustrates a cross-sectional diagram of an example powered flexible hybrid electronics (FHE) device.

DETAILED DESCRIPTION

The detailed description that follows describes exemplary embodiments and the features disclosed are not intended to be limited to the expressly disclosed combination(s). Therefore, unless otherwise noted, features disclosed herein may be combined together to form additional combinations that were not otherwise shown for purposes of brevity.

The present disclosure provides a powered-FHE device with a printed circuit and a thin flexible battery, wherein the circuit and the battery share a common, integral flexible substrate and the battery is electrically connected to the printed circuit. In some embodiments, the powered-FHE device of the present invention further includes one or more conventional packaged components attached to the circuit. In some embodiments, the present invention is described as a monolithic-powered-FHE device and/or a monolithic-powered-integrated-circuit. In some embodiments, the powered-FHE devices is described as an integrated flexible battery circuit.

FIG. 1 shows a cross-sectional diagram of a powered-FHE device 100 according to the present invention. In some embodiments, the powered-FHE device 100 includes a flexible battery 122 and a printed circuit 132 with a common flexible substrate 112 that is integral to both the battery 122 and the printed circuit 132. In other words, the common flexible substrate 112 is an integral part of the flexible battery 122 and also forms the substrate, or base, on which the printed circuit 132 is fabricated or formed. In some embodiments, the battery 122 and the printed circuit 132 are electrically connected by conductive vias 142 formed from a first surface to a second surface of the common substrate 112.

The term "integral common substrate' can be described as a "common substrate", and/or a "shared substrate", and/or a "single shared substrate", and/or an "integral substrate" and/or a monolithic substrate.

In some embodiments, the common substrate 112 is patterned using dry etching, wet etching, and/or laser etching.

In some embodiments, the battery 122 is a primary battery. In other embodiments, the battery 122 is a rechargeable battery.

In some embodiments, the battery 122 (including the cathode, electrolyte, anode, and protective cover) are formed/fabricated first on a first surface of the common substrate and the printed circuit is formed/fabricated second on the second and opposite surface of the common substrate.

In some embodiments, the printed circuit 132 is formed/fabricated first on a first surface of the common substrate 112 and the battery 122 (including the cathode, electrolyte, anode, and protective cover) are formed/fabricated second on the second and opposite surface of the common substrate 122.

In some embodiments, the battery chemistry is lithium-based, or magnesium-based, or any other battery chemistry known to those of skill in the art.

In some embodiments, the powered-FHE 100 shown in FIG. 1 further includes a protective circuit cover (not shown) that protects the printed circuit 132 and electronic components 162.

In some embodiments, a protective battery cover 152 covers the battery 122. The protective battery cover 152 and the protective circuit cover form an intimate seal with the common substrate and to prevent moisture ingress. In some embodiments, the protective battery cover 152 and the protective circuit cover provide a leveling effect such that the topography on each side is reduced, thereby providing a smooth surface on each side of the powered-FHE.

In some embodiments, the printed circuit 132 is selectively printed or otherwise deposited to form the circuit traces by any of a variety of printing or additive deposition methodologies, including, for example, any form of gravure, flatbed screen, flexography, lithography, screen, rotary screen, digital printing, inkjet printing, aerosol jet printing, 3-D printing, and like print methods, or combinations thereof.

In some embodiments, the printed circuit 132 includes conductive traces that are provided by traditional PCB fabrication technology. In yet other embodiments, the conductive traces are provided by conductive wires. In some embodiments, the conductive traces comprise a printable or otherwise selectively deposited conductive material containing metallic particles such as, for example, but not limited to, silver, platinum, palladium, copper, nickel, gold, or aluminum or carbon or conductive polymer, or some combination thereof. The conductive traces can include flakes, fine particulates, or nano-particulates, or combinations thereof, in some embodiments. The conductive traces can be in the form of a printable conductive ink, toner, or other coating. In some embodiments, electrically functional electronic inks are available from Henkel Corporation or DuPont Inc., for example. The conductive traces can also be formed by other means known to those having skill in the art.

In some embodiments, the common substrate 112 has a thickness of less than or equal to 1 mil. In other embodiments, the common substrate 112 has a thickness that is less than 10 mil, and more specifically, a thickness that is less than 5 mil. In some embodiments, the common substrate 112 is less than 0.5 mil.

In some embodiments, the powered-FHE device 110 has a total thickness that is less than 500 microns, or less than 250 microns, or less than 100 microns. For example, the FHE device have a total thickness between 50 microns to 1000 microns.

In some embodiments, the size of the battery 122 is less than approximately 6 cm×6 cm, or less than approximately 4 cm×4 cm, or less than approximately 2 cm×2 cm.

In some embodiments, the common substrate 112 includes one or more of any of a number of flexible materials, such as polymeric materials including but not limited to, polyethylene terephthalate film (PET), polyethylene naphthalate (PEN), polyimide foil (PI), polypropylene, polyethylene, polystyrene, polycarbonate, polyether ether ketone (PEEK), or any of a variety of polymer films or combinations thereof. In other embodiments, the common substrate 112 includes a flexible ceramic material, for example, zirconium, or YSZ, or any other flexible ceramic material. In an alternative embodiment, the common substrate 112 is semi-flexible and comprises thin ceramic, thin glass, wood, metal, PVC, silicon, epoxy resin, polycarbonate, or any of a variety of semi-flexible materials or combinations thereof. In yet another embodiment, the common substrate 112 includes a combination of one or more flexible materials described herein and one or more semi-flexible materials described herein. In yet other embodiments, the common substrate 112 includes rigid portions in combination with flexible or semi-flexible materials described herein.

In some embodiments, the powered-FHE device 100 includes an integrated wireless communication chip that includes the capability for one or more wireless communication protocol, including RFID, NFC, Bluetooth, LoRa, SigFox, ZigBee, Wi-Fi, Wi-MAX, or other useful wireless protocol.

In some embodiments, the powered-FHE device is a powered-RFID tag. In other embodiments, the powered-FHE device is a tamper evident powered-RFID tag, that provides circuitry to detect when the RFID tag has been removed from an object the tag has been affixed to. In some embodiments, the tamper evident RFID tag will cease functioning when removed from the object the tag has been affixed to.

In some embodiments, the powered-FHE device 100 includes an integrated antenna formed from a conductive trace using any of the additive techniques described herein. In other embodiments, integrated antenna is formed from wire coils. In yet other embodiments, integrated antenna is formed using photolithographic techniques and wet or dry etching.

In some embodiments, the powered-FHE device 100 further includes a photovoltaic cell, integrally formed on the common substrate, to recharge the battery.

In some embodiments, the powered-FHE device 100 can operate at elevated temperatures. For example, at temperatures greater than 80 C, or greater than 100 C, or greater than 120 C, or greater than 150 C, and/or greater than 180 C.

The powered-FHE device 100 can form an inlay. In other embodiments, the powered-FHE device 100 is embossable.

The printed circuit 132 can include an ultra-thin and flexible high-performance integrated circuit.

In some embodiments, the powered-FHE device 100 includes one or more sensors, including thermistors, temperature, humidity, acceleration, and or the like.

In some embodiments, the powered-FHE device 100 further includes a label material adhered to a first surface and a pressure sensitive adhesive applied to the second and opposite surface.

In some embodiments, a hydrogel is applied to a surface of the powered-FRE device 100.

In some embodiments, the powered-FHE 100 includes a supercapacitor formed on a first surface of the common substrate and a printed circuit formed on an opposite side of the common substrate, the common substrate being integral to the formation of the supercapacitor and the printed circuit.

In some embodiments, the powered-FHE device 100 includes packaged components and devices that are attached to the conductive traces using one or more of the following attachment techniques including, solder, low temperature solder, conductive epoxy, anisotropic conductive adhesive, and the like.

In some embodiments, the powered-FHE device 100 includes conductive traces on the top surface and the bottom surface of the common substrate, wherein the top and bottom conductive traces are electrically connected through vias formed using one or more of the following methods, including lasered vias, poke-through via, and the like.

It will be appreciated that the foregoing description provides examples of the disclosed system and technique. However, it is contemplated that other implementations of the disclosure may differ in detail from the foregoing examples. All references to the disclosure or examples thereof are intended to reference the particular example being discussed at that point and are not intended to imply any limitation as to the scope of the disclosure more generally. All language of distinction and disparagement with respect to certain features is intended to indicate a lack of preference for those features, but not to exclude such from the scope of the disclosure entirely unless otherwise indicated.

Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context.

Accordingly, this disclosure includes all modifications and equivalents of the subject matter recited in the claims appended hereto as permitted by applicable law. Moreover, any combination of the above-described elements in all possible variations thereof is encompassed by the disclosure unless otherwise indicated herein or otherwise clearly contradicted by context.

The invention claimed is:

1. A flexible hybrid electronics (FHE) device comprising:
a common flexible substrate with a first surface and a second surface opposite the first surface;
a printed circuit coupled to the first surface of the common flexible substrate;
a battery coupled to the second surface of the common flexible substrate, the battery comprising:
a flexible cathode layer coupled to a bottom surface of the common flexible substrate;
a flexible electrolyte layer coupled to the cathode layer; and
a flexible anode layer coupled to the electrolyte layer;
a first via through the common flexible substrate that connects the flexible cathode layer of the battery to the printed circuit; and
a second via through the common flexible substrate that connects the flexible anode layer of the battery to the printed circuit.

2. The FHE device of claim 1, further comprising electronic components coupled to the printed circuit.

3. The FHE device of claim 1, wherein the common flexible substrate is integral to the battery and the printed circuit.

4. The FHE device of claim 1, wherein the common substrate is patterned using at least one of dry etching, wet etching, or laser etching.

5. The FHE device of claim 1, further comprising a protective circuit cover that covers printed circuit and a protective battery cover that covers the battery.

6. The FHE device of claim 5, wherein the protective circuit cover and the protective battery cover form an intimate seal to prevent moisture ingress into the FHE device.

7. The FHE device of claim 5, wherein the protective circuit cover and the protective battery cover each provide a leveling effect which reduces topography on each side of the FHE device.

8. The FHE device of claim 1, wherein the common substrate has a thickness of 0.5 millimeter to 10 millimeters.

9. The FHE device of claim 1, wherein the FHE device has a total thickness between 50 microns to 1000 microns.

10. The FHE device of claim 1, wherein the common substrate comprises one or more flexible materials, such as polymeric materials including but not limited to, polyethylene terephthalate film (PET), polyethylene naphthalate (PEN), polyimide foil (PI), polypropylene, polyethylene, polystyrene, polycarbonate, or polyether ether ketone (PEEK).

11. The FHE device of claim 1, wherein the common substrate comprises one or more flexible ceramic materials, such as zirconium, or YSZ, or any other flexible ceramic material. In an alternative embodiment, the common substrate 112 is semi-flexible and comprises thin ceramic, thin glass, wood, metal, PVC, silicon, epoxy resin, or polycarbonate.

12. The FHE device of claim 1, wherein the common substrate is semi-flexible and comprises one or more of thin ceramic, thin glass, wood, metal, PVC, silicon, epoxy resin, or polycarbonate.

13. The FHE device of claim 1, further comprising an integrated wireless communication chip that includes the capability for one or more wireless communication protocol, such as RFID, NFC, Bluetooth, LoRa, SigFox, ZigBee, Wi-Fi, Wi-MAX, or other wireless protocol.

14. The FHE device of claim 1, further comprising an integrated antenna formed from one or more of a conductive trace, at least one wire coil, photolithographic techniques, or wet or dry etching.

15. The FHE device of claim 1, further comprising a photovoltaic cell, integrally formed on the common flexible substrate, to recharge the battery.

16. The FHE device of claim 1, further comprising one or more sensors such as a thermistor, temperature, humidity, or acceleration sensor.

17. The FHE device of claim 1, further comprising a label material adhered to a first surface of the FHE device and a pressure sensitive adhesive applied to a second and opposite surface of the FHE device.

18. The FHE device of claim 1, further a hydrogel is applied to a surface of the FHE device.

19. The FHE device of claim 1, further a supercapacitor formed on the first surface of the common flexible substrate and a second printed circuit formed on the second surface of the common substrate, the common flexible substrate being integral to the formation of the supercapacitor and the second printed circuit.

20. The FHE device of claim 1, further comprising a top conductive trace and a bottom conductive trace on the first surface and the second surface of the common flexible substrate respectively, wherein the top and bottom conductive traces are electrically connected by vias.

* * * * *